(12) United States Patent
Peng

(10) Patent No.: US 8,212,657 B2
(45) Date of Patent: Jul. 3, 2012

(54) VIBRATION ASSEMBLY FOR PORTABLE ELECTRONIC DEVICE

(75) Inventor: Tse-Shan Peng, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 471 days.

(21) Appl. No.: 12/479,923

(22) Filed: Jun. 8, 2009

(65) Prior Publication Data

US 2009/0315689 A1    Dec. 24, 2009

(30) Foreign Application Priority Data

Jun. 20, 2008   (CN) .......................... 2008 1 0302257

(51) Int. Cl.
  *H04B 3/36*   (2006.01)
  *G10K 1/26*   (2006.01)
  *H02K 7/06*   (2006.01)

(52) U.S. Cl. ................... 340/407.1; 340/7.6; 340/391.1; 340/396.1; 310/81

(58) Field of Classification Search ............... 340/407.1, 340/7.6; 310/81
See application file for complete search history.

(56) References Cited

U.S. PATENT DOCUMENTS

| 5,898,248 | A | * | 4/1999 | Ikeda et al. ..................... 310/91 |
| 6,227,901 | B1 | * | 5/2001 | Pupkiewicz et al. .......... 439/500 |
| 6,542,381 | B1 | * | 4/2003 | Sei et al. ....................... 361/801 |

FOREIGN PATENT DOCUMENTS

CN       1175882 A       3/1998

* cited by examiner

*Primary Examiner* — Donnie Crosland
(74) *Attorney, Agent, or Firm* — Altis Law Group, Inc.

(57) ABSTRACT

A vibrating device for portable electronic device includes a frame, a main circuit board, a motor and a secondary circuit board. The frame defines a recess and a receiving hole. The main circuit board is fixed in the recess of the frame. The motor is fixed in the receiving hole of the frame. The secondary circuit board electronically connects the main circuit board and the motor.

7 Claims, 2 Drawing Sheets

VIBRATION ASSEMBLY FOR PORTABLE ELECTRONIC DEVICE

BACKGROUND

1. Technical Field

The present invention relates to vibrating devices, particularly, to a vibrating device for portable electronic devices.

2. Description of Related Art

With the development of wireless communication and information processing technologies, portable electronic devices, such as mobile telephones and personal digital assistants (PDAs), are now in widespread use. These portable electronic devices enable consumers to enjoy high technology services, anytime and anywhere. Vibrating devices are widely used in portable electronic devices, for creating a vibration that can signal users of an incoming message or incoming call.

The vibrating device needs to connect with a circuit board of the portable electronic device, and a conventional Vibrating device is generally fixed on a top surface of the circuit board. However, this does not satisfy the compact size of the portable electronic device.

Therefore, there is space for improvement within the art.

BRIEF DESCRIPTION OF THE DRAWINGS

Many aspects of the vibrating device can be better understood with reference to the following drawings. The components in the drawings are not necessarily drawn to scale, the emphasis instead being placed upon clearly illustrating the principles of the present vibrating device, in which.

DETAILED DESCRIPTION OF THE EMBODIMENTS

Figure 1:
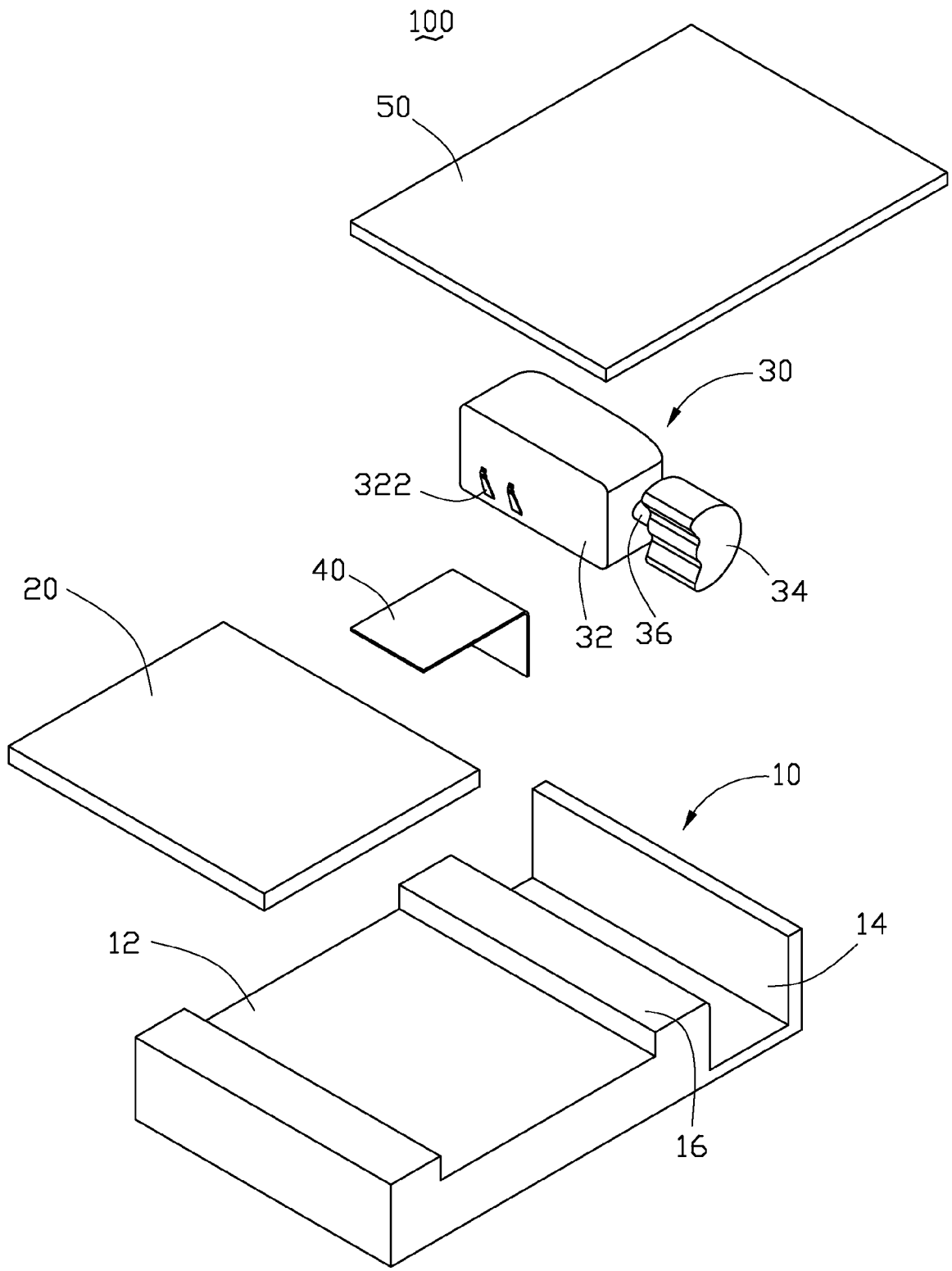
FIG. 1 is an exploded, schematic view of a vibrating device for portable electronic device, in accordance with an exemplary embodiment.

Referring to FIG. 1, a vibrating device 100 for portable electronic device includes a frame 10, a main circuit board 20, a motor 30, a secondary circuit board 40 and a cover 50, in accordance with an exemplary embodiment.

The frame 10 is integrally formed with a housing of a portable electronic device (not shown), and defines a circuit housing 12 and a motor housing 14. A wall 16 is formed between the recess 12 and the receiving hole 14. The recess 12 is configured for receiving the main circuit board 20, and the receiving hole 14 is configured for receiving the motor 30.

The motor 30 includes a main body 32, a rotor 36, and an irregular driver 34 mounted on the rotor 36. The eccentric wheel 34 is rotatably connected to the main body 32 by the shaft 36. Two metal contacts 322 extending out from the main body 32, are for electronically connecting with the secondary circuit board 40.

The secondary circuit board 40 is a flexible printed circuit board, and is bent to cling to the wall 16. One end of the secondary circuit board 40 is configured for electronically connecting with the main circuit board 20, and another end has two connectors (not shown) thereon for electrically connecting with the metal contacts 322 of the motor 30 correspondingly.

Figure 2:
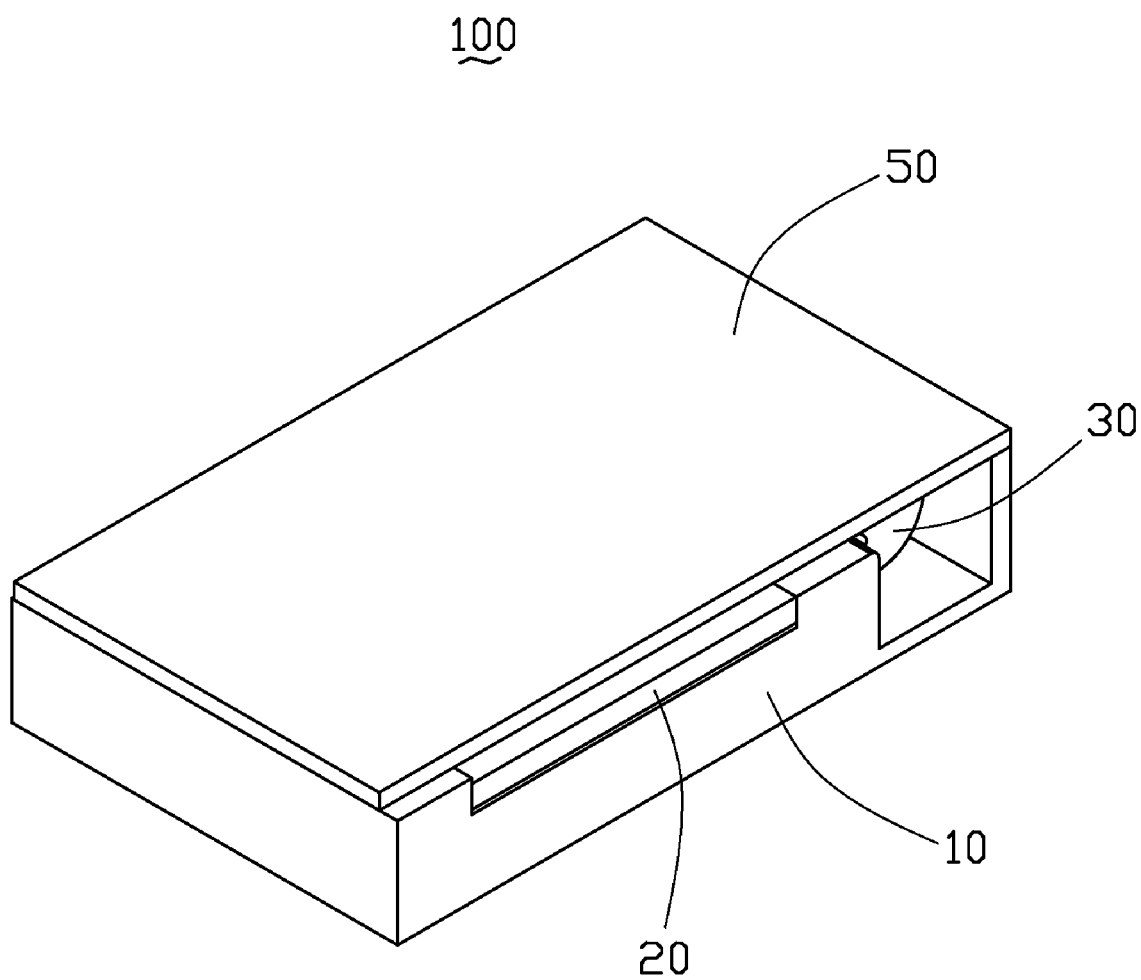
FIG. 2 is an assembled, schematic view of the vibrating device shown in FIG. 1.

In assembly of the vibrating device 100, also referring to FIG. 2, the main circuit board 20 is disposed in the recess 12 of the frame 10. The secondary circuit board 40 then clings to the wall 16, with one end electronically connecting with the main circuit board 20. The motor 30 is received in the receiving hole 14, with the sheet metals 322 electronically connecting with the connectors of the secondary circuit board 40, so that the motor 30 is electronically connected with the main circuit board 20. At last, the cover 50 is attached to the frame 10 to fix the main circuit board 20, the secondary circuit board 40, and the motor 30 together.

It is to be understood that because the motor 30 is set beside the main circuit board 20, the thickness (width) of the portable electronic device can be reduced.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A vibrating device for portable electronic device comprising:
   a frame defining a recess and a receiving hole;
   a main circuit board fixed in the recess of the frame;
   a motor fixed in the receiving hole of the frame and for producing vibration; and
   a secondary circuit board electronically connecting the main circuit board and the motor; wherein a wall is formed between the recess and the receiving hole, and the secondary circuit board at least partially clings to the wall.

2. The vibrating device as claimed in claim 1, wherein the secondary circuit board is a flexible printed circuit board.

3. The vibrating device as claimed in claim 1, wherein the motor includes a main body, two metal sheets extending out from the main body, and two connectors are formed at one end of the secondary circuit board for electronically connecting with the sheet metals.

4. The vibrating device as claimed in claim 1, further comprising a cover, wherein the cover is attached to the frame so as to fix the main circuit board, the secondary circuit board and the motor.

5. A vibrating device for portable electronic device comprising:
   a frame;
   a main circuit board fixed in the frame;
   a motor fixed in the frame beside the main circuit board and for producing vibration;
   a secondary circuit board electronically connecting the main circuit board and the motor; and
   a cover attached to the frame so as to fix the main circuit board, the secondary circuit board and the motor.

6. The vibrating device as claimed in claim 5, wherein the secondary circuit board is a flexible printed circuit board.

7. The vibrating device as claimed in claim 6, wherein the motor includes a main body, two metal sheets extending out from the main body, and two connectors are formed at one end of the secondary circuit board to electronically connect with the sheet metals.

* * * * *